United States Patent [19]
Kudoh

[11] Patent Number: 5,937,356
[45] Date of Patent: Aug. 10, 1999

[54] RADIO SELECTIVE CALL RECEIVER CAPABLE OF ADJUSTING RADIO SIGNAL LEVEL

[75] Inventor: Kazuhiro Kudoh, Shizuoka, Japan

[73] Assignee: NEC Corporation, Tokyo, Japan

[21] Appl. No.: 08/805,345

[22] Filed: Feb. 24, 1997

[30] Foreign Application Priority Data

Feb. 26, 1996 [JP] Japan .................................. 8-038189

[51] Int. Cl.$^6$ .............................. H04B 7/26; H04B 1/10
[52] U.S. Cl. .................. 455/502; 455/249.1; 455/250.1; 455/254
[58] Field of Search .................................. 455/38.1, 38.3, 455/38.2, 343, 502, 232.1, 234.1, 234.2, 249.1, 250.1, 254, 226.1, 63; 340/825.44, 311.1

[56] References Cited

U.S. PATENT DOCUMENTS 5,369,799  11/1994  Tsunoda .
5,448,774   9/1995  Yokozaki et al. ..................... 455/343

*Primary Examiner*—Nguyen Vo
*Attorney, Agent, or Firm*—Young & Thompson

[57] ABSTRACT

In a radio selective call receiver for lowering a radio signal level in accordance with the state where reception of a sync signal is enabled/disabled, an amplifier 53 amplifies a radio signal fed from a base station. A frequency converter 54 shifts a frequency of the radio signal amplified in the amplifier 53 to a first frequency band and a second frequency band. A demodulator 55 converts a radio signal shifted to the second frequency band by the frequency converter 54 into a base band signal. A level detector 56 outputs a direct current voltage relative to an electric field intensity level of the radio signal shifted to the second frequency band by the frequency converter 54. A comparator 57 compares the direct current voltage output from the level detector 56 with a predetermined voltage. A controller 42 judges whether a first sync signal can be received by a base band signal demodulated by the demodulator 55, and outputs a control signal "L" to an attenuation circuit 52 when determined that reception of the first sync signal is impossible. The attenuation circuit 52 lowers the level of the radio signal by the control signal "L" output from the controller 42.

18 Claims, 12 Drawing Sheets

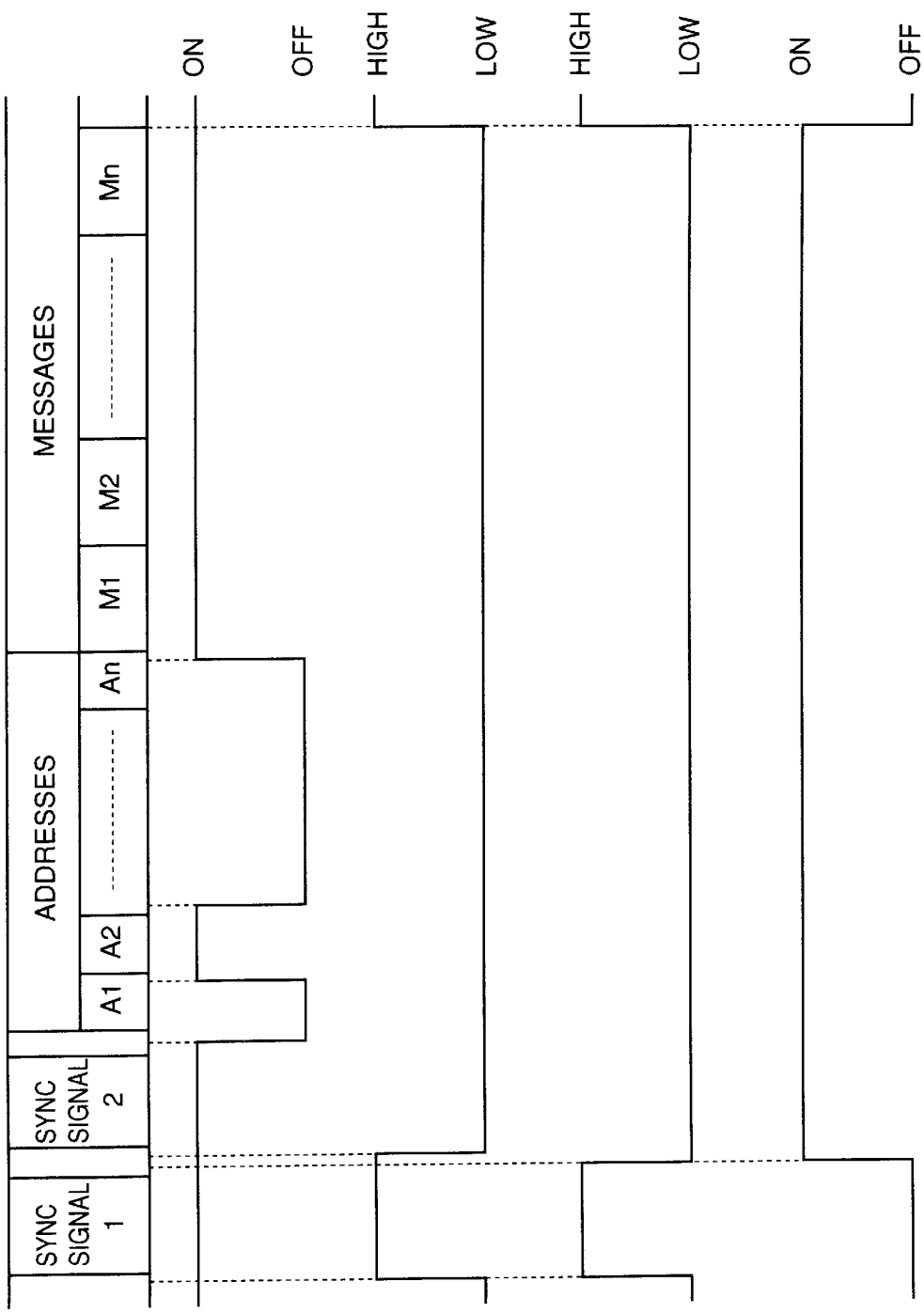

RADIO SELECTIVE CALL RECEIVER CAPABLE OF ADJUSTING RADIO SIGNAL LEVEL

BACKGROUND OF THE INVENTION

1. Field of the Invention

The present invention relates to a radio selective call receiver, and more particularly to a radio selective call receiver for receiving a radio signal of a signal format having a plurality of sync signals in one frame.

2. Description of the Related Art

With rapid spread of radio selective call services and liberalization of services, increase in a number of lines and in the data transfer rate has been recently intended, and frequencies of electric waves used for the radio selective call services tend to increase. Under such circumstances, when an electric field intensity of a desired wave received by its own radio selective call receiver is smaller than that of a wave received by any other radio selective call receiver, the latter wave serves as an interfering wave. There occurs such a problem as that the interfering wave extremely degrades a receiving ratio of the radio selective call receiver by intermodulation of a plurality of waves.

Two techniques have been used as a prior art for solving the above problem. A first technique lowers a level of a radio signal to prolong a preamble search mode when a bit synchronization can not be achieved due to the interfering wave. A second technique lowers a level of the radio signal received according to the receive synchronization enabled/disabled state.

The radio selective call receiver in the first technique is disclosed in, for example, U.S. patent application Ser. No. 08/365434 (Japanese laid-open patent application heisei 5-336605).

With this radio selective call receiver, a controller turns on an attenuation circuit to increase a number of bits of a preamble search mode by a predetermined number if the controller can not achieve the bit synchronization and determines that the interfering wave is generated from an output of a comparator. When the attenuation circuit is turned on, a level of the radio signal is attenuated, improving the receiving rate.

In this radio selective call receiver, however, when the interfering wave is generated, a number of bits of the preamble search mode must be increased and the efficiency of a receiver power supply can not be therefore enhanced.

On the other hand, a radio selective call receiver in the second technique is disclosed in, for example, U.S. Pat. No. 5,369,799.

In this radio selective call receiver, a decoder detects a frame-sync signal and a group-sync signal from a received signal, thereby achieving the receive synchronization. If at least either the frame-sync signal or the group-sync signal is not detected, the decoder outputs a control signal. A gain control circuit controls gain allocation of the received signal based on the control signal from the decoder.

In this radio selective call receiver, however, allocation of the gain of the radio signal input to a receiver section in a second frame is changed when the frame-sync signal and the group-sync signal are not detected in a first frame, and hence the receiving opportunity is lost for the first frame.

SUMMARY OF THE INVENTION

An object of the present invention is to provide an improved radio selective call receiver free from the above-described drawbacks.

It is another object of the present invention to provide a radio selective call receiver for making judgment upon whether at least one sync signal among a plurality of sync signals is received to reduce the radio signal level and for improving the receiving ratio, as will be described later.

It is still another object of the present invention to provide a radio selective call receiver for receiving a radio selective call signal within the same frame with the sync signal to prevent the receiving opportunity from being lost.

To this end, the radio selective call receiver according to one aspect of the present invention has a controller which judges whether reception of a first sync signal is enabled from the radio signal having a plurality of sync signals and outputs a control signal "L" to an attenuation circuit with a timing at which a second sync signal is received to lower the radio signal level when judged that reception of the first sync signal is disabled. The judgment upon whether reception of the first sync signal is enabled is preferably performed using a base band signal demodulated in a demodulator and a result of comparing a direct current voltage relative to an electric field intensity level of the radio signal with a predetermined voltage in a comparator. Further, it is preferable that the controller detects a second sync signal and informs that a call number in a self-frame has been received using an informing section at the time of receiving that call number, thereby displaying a message on a display section.

In this arrangement, according to the present invention, when a controller has judged whether reception of the first sync signal is enabled and has determined that the first sync signal can not be received, the control signal "L" is output to the attenuation circuit to lower the level of the radio signal which may serve as the interfering wave with a timing at which the attenuation circuit receives the second sync signal. The present invention therefore lowers the level of the radio signal with a timing at which the second sync signal is received when determined that reception of the first sync signal is disabled, which can improve the receiving ratio and prevent the receiving opportunity from being lost by receiving a call number in the same frame.

BRIEF DESCRIPTION OF THE DRAWINGS

These and other objects, feature and advantages of the invention will become more fully apparent from the following detailed description taken in conjunction with accompanying drawings, wherein:

FIGS. 12A to 12D are timing charts showing the transmission timing of a control signal according to the present invention.

DETAILED DESCRIPTION OF THE PREFERRED EMBODIMENT

For an easy understanding of the present invention, the above-described two techniques will now be described with reference to FIGS. 1, 2, 3 and 4.

The above first technique will be first explained in connection with FIGS. 1 and 2.

Figure 1:
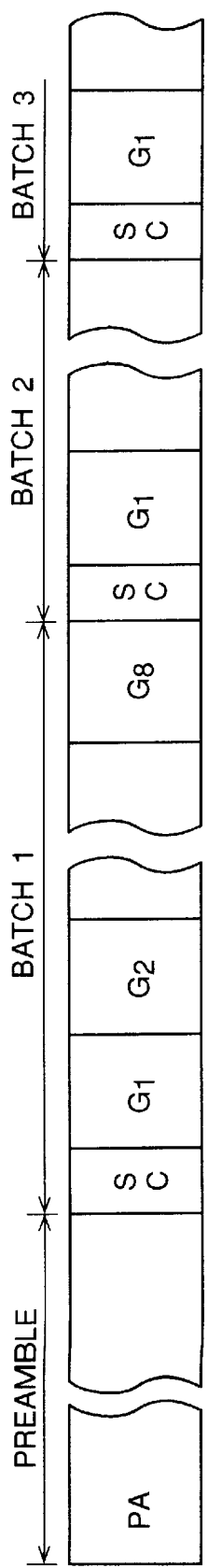
FIG. 1 is a signal transfer format applied to a first prior art radio selective call receiver.

In FIG. 1, a signal transfer format applied to the radio selective call receiver is constituted by a preamble signal PA and a plurality of batch signals following the preamble signal PA. Each batch signal is formed by sequentially arranging a sync-code word SC and eight frames G1 to G8.

Figure 2:
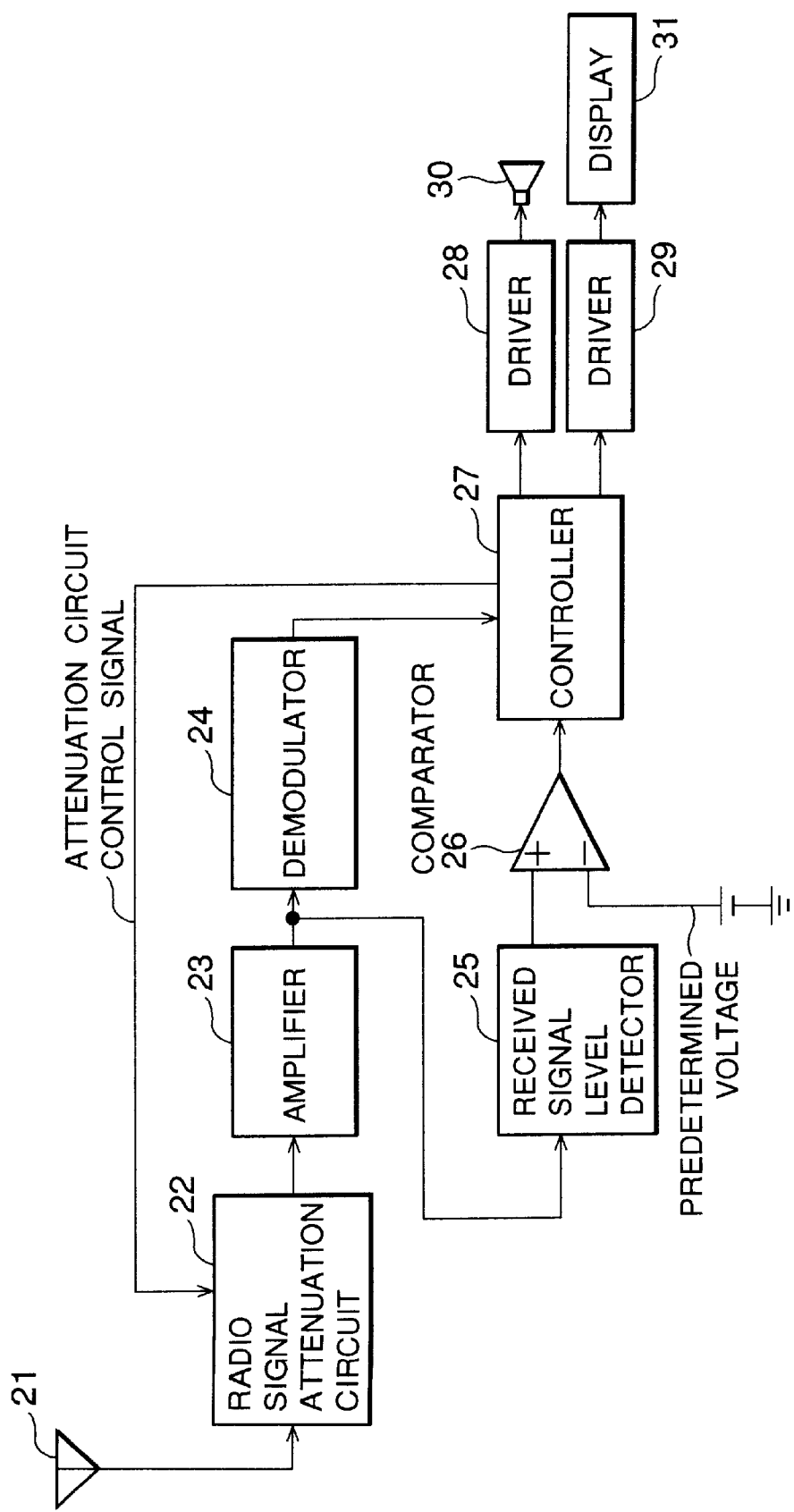
FIG. 2 is a block diagram showing a circuit configuration of the first prior art radio selective call receiver.

In FIG. 2, a radio signal received by an antenna 21 is input to an amplifier 23 in this radio selective call receiver. The radio signal amplified in the amplifier 23 is converted into a base band signal in a demodulator 24. A received signal level detector 25 outputs a direct current voltage according to a level of the radio signal amplified by the amplifier 23. A comparator 26 compares the direct current voltage output from the received signal level detector 25 with a predetermined voltage to output a receive electric field level to a controller 27. The controller 27 judges upon whether bit synchronization is achieved by the base band signal from the demodulator 24. If the controller 27 can not attain bit synchronization and an output from the comparator 26 corresponds to "High", namely, the direct current voltage output by the received signal level detector 25 is larger than the predetermined voltage, the controller 27 turns on a radio signal attenuation circuit 22 to increase a number of bits of the preamble search mode. A number of bits of the preamble search mode returns to its original number when a predetermined time lapses. In this manner, when the signal of its own group is confirmed and a call number coincides with its own call number, informing sections 28 to 31 inform of a carrier of the receiver that effect.

In this radio selective call receiver, however, when the interfering wave is generated, a number of bits of the preamble search mode is repeatedly increased or returned to its original number until a preamble signal is detected in, and the efficiency of the receiver power supply can not be therefore improved, requiring a long time to detect the sync signal and call up a user on the remote side.

The above-mentioned second technique will now be described with reference to FIGS. 3 and 4.

Figure 3:
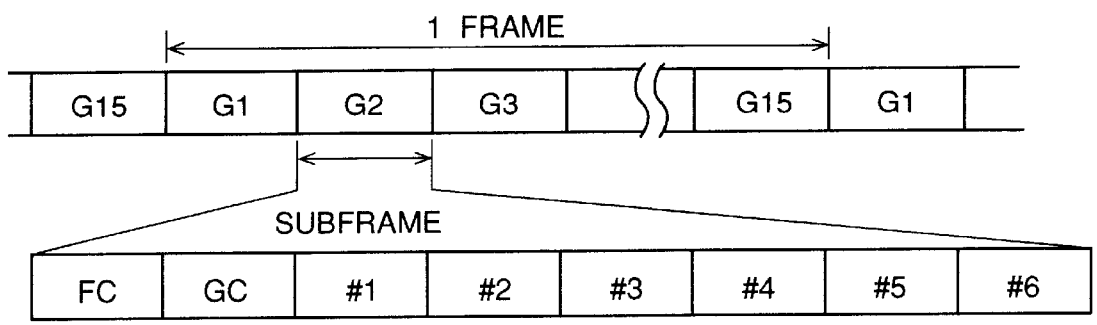
FIG. 3 is a signal transfer format applied to a second prior art radio selective call receiver.

In FIG. 3, one frame including a plurality of subframes G1 to G15 in the signal format applied to this radio selective call receiver. In addition, each subframe is constituted by sequentially arranging a common frame-sync signal FC, a group-sync signal GC inherent to each sub-frame, and a plurality of radio selective call numbers #1 to #6.

Figure 4:
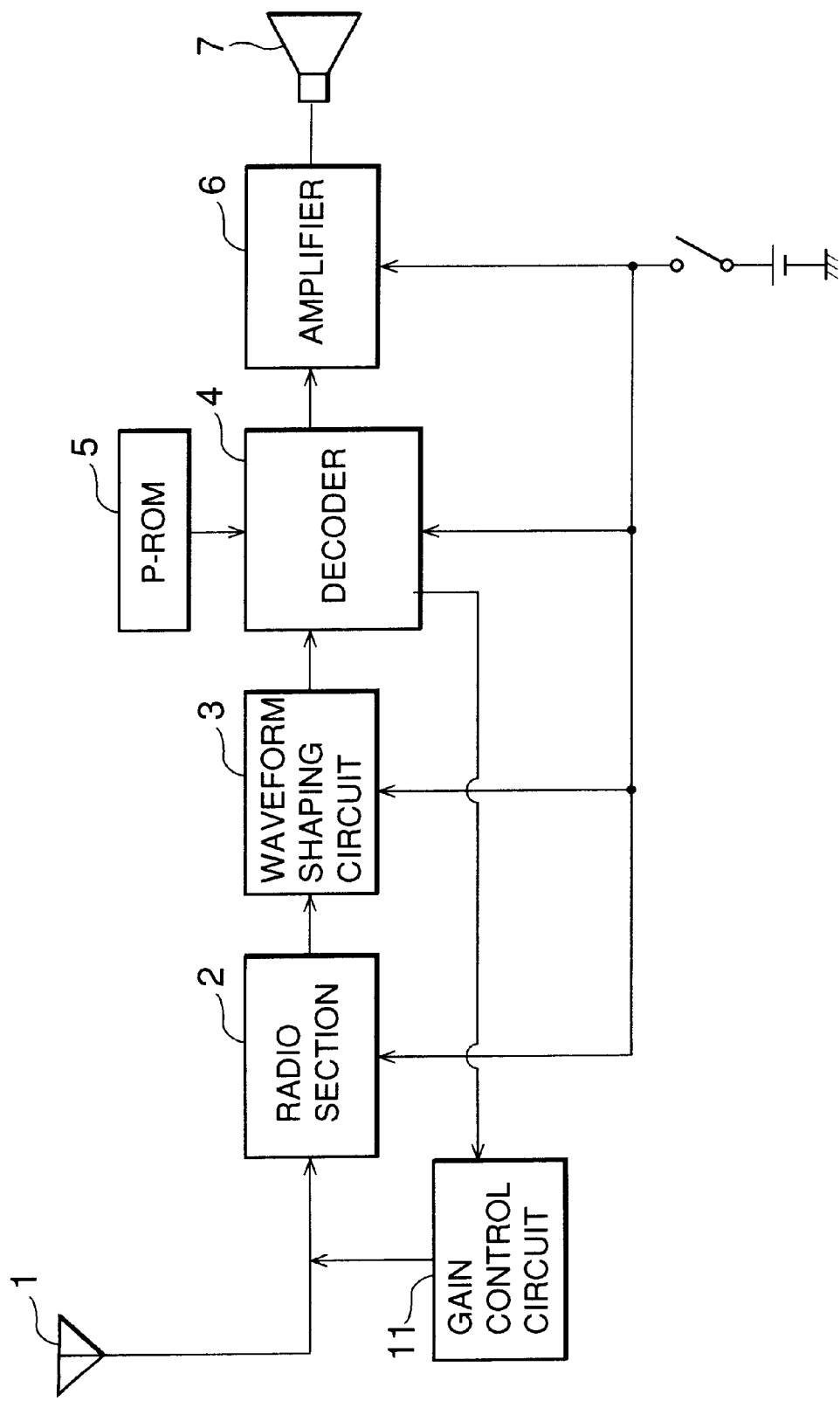
FIG. 4 is a block diagram showing a circuit configuration of the second prior art radio selective call receiver.

Referring to FIG. 4, in this radio selective call receiver, a radio signal received by an antenna 1 is amplified in a receiver 2 with a predetermined gain and thereafter demodulated. The demodulated signal is converted into a digital data signal by a waveform shaping circuit 3. A decoder 4 detects a frame-sync signal FC and a group-sync signal GC from the data signal output from the waveform shaping circuit 3 to establish receive synchronization. Upon establishing receive synchronization, reception of the radio selective call numbers #1 to #6 is allowed. Each of the received radio selective call numbers is compared with its own selective call number previously recorded in a P-ROM 5. When these numbers have coincided with each other, the decoder 4 outputs an alert signal to an amplifier 6 to generate sound from a speaker 7. In addition, when the decoder 4 can not detect at least either the frame-sync signal FC or the group-sync signal GC, an ON control signal and an OFF control signal are output in accordance with a number of times that no detection was made. A gain control circuit 11 controls the gain allocation of the radio signal input to the receiver 2 based on the ON control signal and the OFF control signal output from the decoder 4. When the decoder 4 can not sequentially detect the frame-sync signals FC and the group-sync signals GC for a predetermined number of times, reception of the radio selective call numbers #1 to #6 is prohibited.

In this radio selective call receiver, however, when the frame-sync signal and the group-sync signal can not be detected due to affection of the interfering wave within a first frame, the gain allocation of the radio signal input to the receiver is changed in a second frame. In other words, a call is impossible in the first frame, but receiving at least the second frame enables the call. Since the call is disabled in the first frame, the receiving opportunity is therefore lost.

In view of the above-mentioned problems, the present invention decreases the loss of the receiving opportunity and rapidly calls a user on the remote side by providing a plurality of sync signals in each frame, lowering the level of the radio signal when a first sync signal was not detected and detecting a second sync signal in the same frame to make a call.

The present invention will now be described in detail with reference to FIGS. 5 to 12D.

Figure 5:
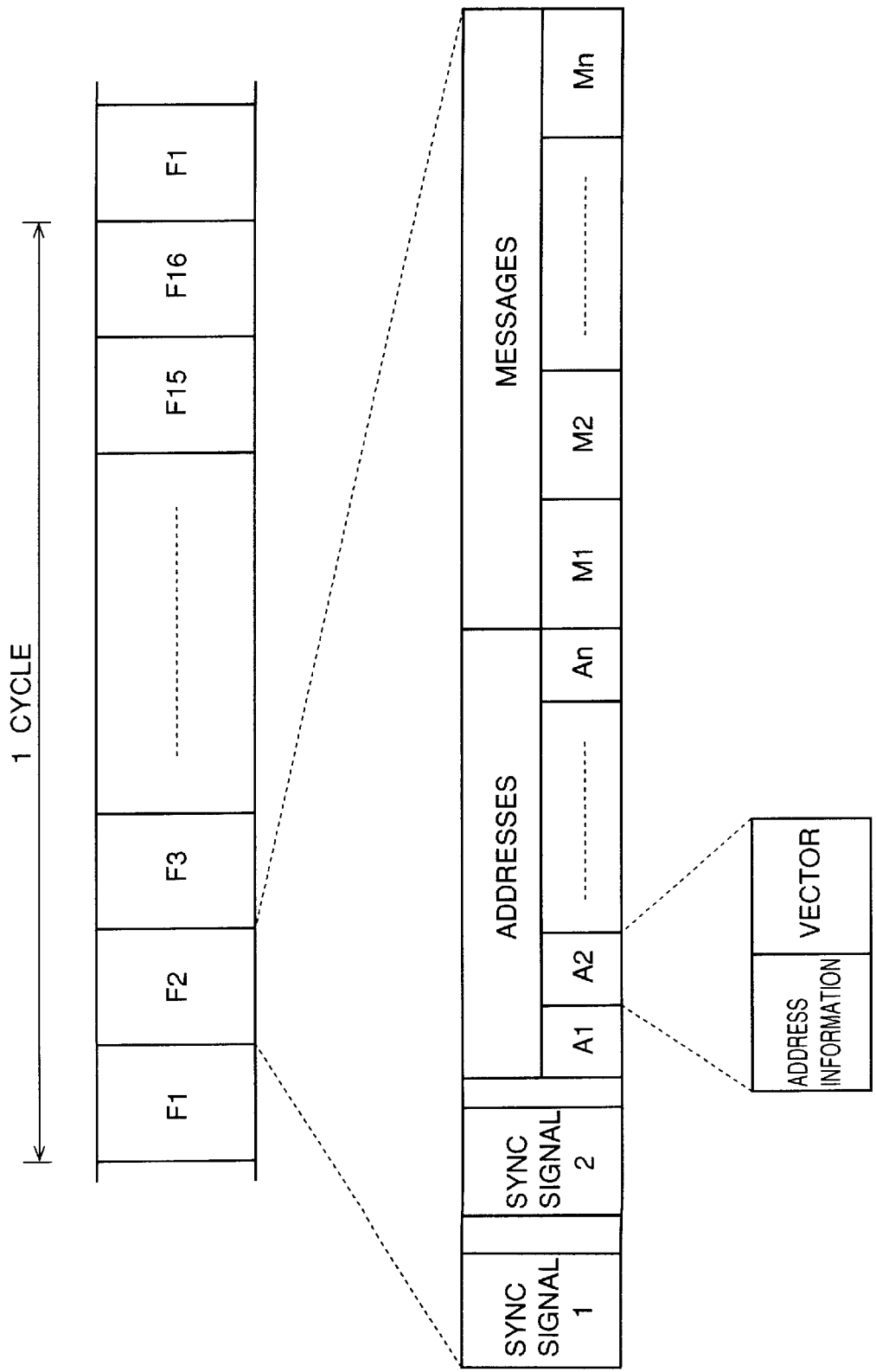
FIG. 5 is a signal transfer format applied to a radio selective call receiver according to the present invention.

Referring to FIG. 5, the signal transfer format applied to the radio selective call receiver according to the present invention will be explained.

In FIG. 5, the radio selective call receiver according to the present invention adopts the binary FSK (frequency shift keying) modulation or the quadrature FSK modulation, and one cycle is made up of 16 frames F1 to F16. In the signal transfer format applied to the radio selective call receiver according to the present invention, one frame is constituted by sequentially arranging a sync signal 1, a sync signal 2, addresses A1 to An, messages M1 to Mn. Each address consists of address information and a vector.

The vector indicates a position of a message relative to address information to be called or a position where the message starts.

Assuming that only one sync signal usually exists in one frame and that sync signal is composed of 32 bits in this signal format, each of the sync signals 1 and 2 according to the present invention is composed of 32 bits. For example, the sync signal 1 corresponds to "1011" and the sync signal 2 to "10111".

The sync signals 1 and 2 are detected by confirming whether their bit strings coincide with a predetermined bit string.

Figure 6:
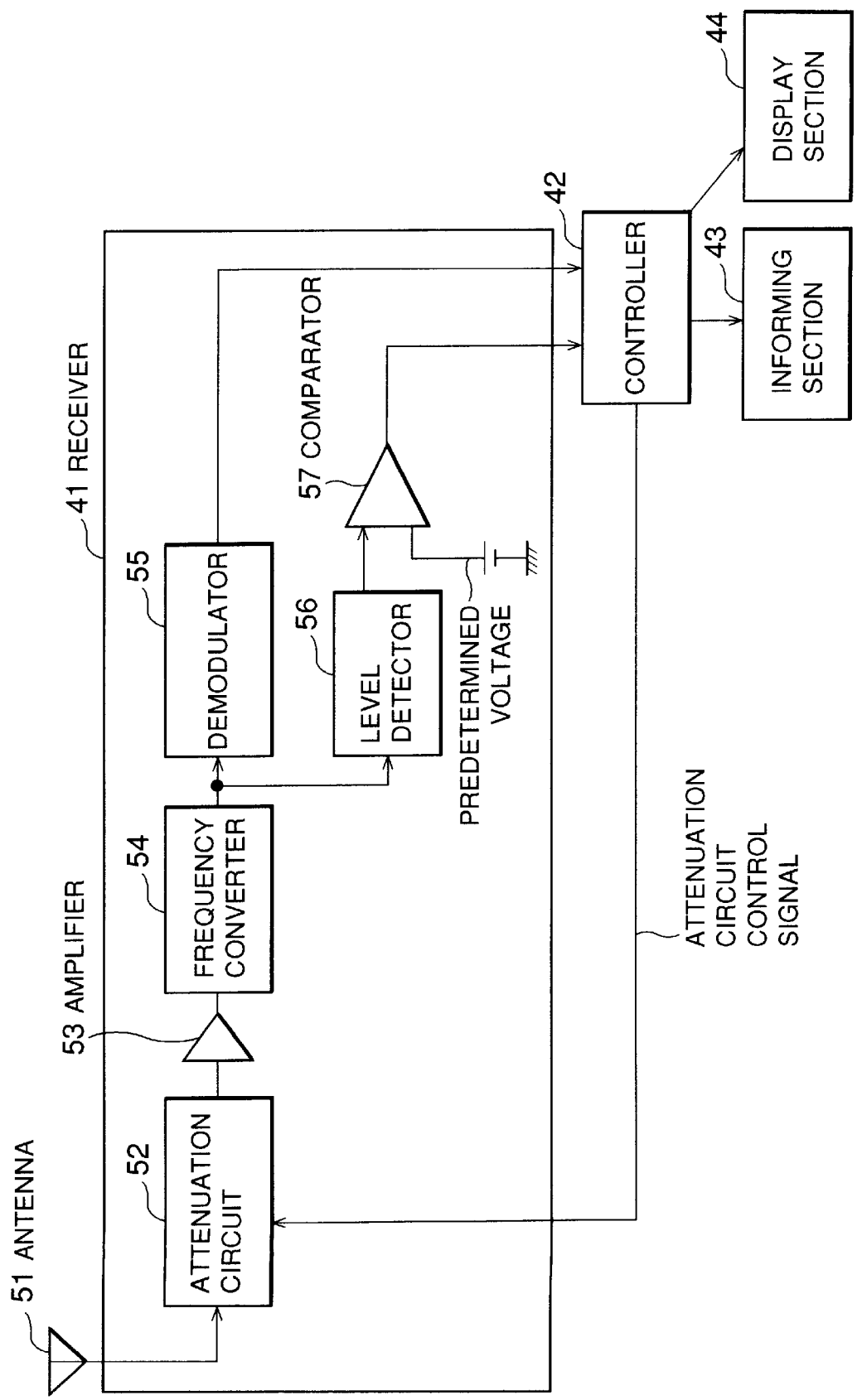
FIG. 6 is a block diagram showing an embodiment of the radio selective call receiver according to the present invention.

In FIG. 6, the radio selective call receiver according to the present invention includes a receiver 41, a controller 42, an informing section 43, and a display section 44. The receiver 41 is provided with an antenna 51, an attenuation circuit 52, an amplifier 53, a frequency converter 54, a demodulator 55, a level detector 56 and a comparator 57.

The receiver 41 receives the radio signal having the signal format shown in FIG. 5 and fed from a non-illustrated base station by the antenna 51. The attenuation circuit 52 lowers the level of the radio signal using a control signal "L" from the controller 42 which will be described later. The amplifier 53 amplifies the radio signal. The frequency converter 54 shifts the frequency of the radio signal amplified in the amplifier 53 to a first frequency band and a second frequency band. The demodulator 55 demodulates the radio signal shifted to the second frequency band by the frequency converter 54 into a base band signal. The level detector 56 outputs a direct current voltage corresponding with an electric field intensity level of the radio signal shifted to the second frequency band by the frequency converter 54. The comparator 57 compares the direct current voltage output by the level detector 56 with a predetermined voltage. If the direct current voltage output by the level detector 56 is larger than a predetermined voltage, the comparator 57 outputs a receive electric field level "H".

The controller 42 judges whether the first sync signal can be received by using the base band signal demodulated by the demodulator 55. When it has been determined that the first sync signal can not be received due to intermodulation of the interfering wave based on the receive electric field level output from the comparator 57, a control signal "L" is output to the attenuation circuit 52 to lower the level of the radio signal that may serve as the interfering wave with a timing at which the second sync signal is received. When the second sync signal was received, an address and a message in the same frame are received.

The informing section 43 informs that a call number of its own radio selective call receiver was received. The informing section 43 may be preferably constituted by a speaker, a LED, a vibrator or the like.

The display section 44 displays the received message. The display section 44 may be preferably constituted by a cathode ray tube (CRT), a liquid crystal display (LCD) or the like.

Figure 7:
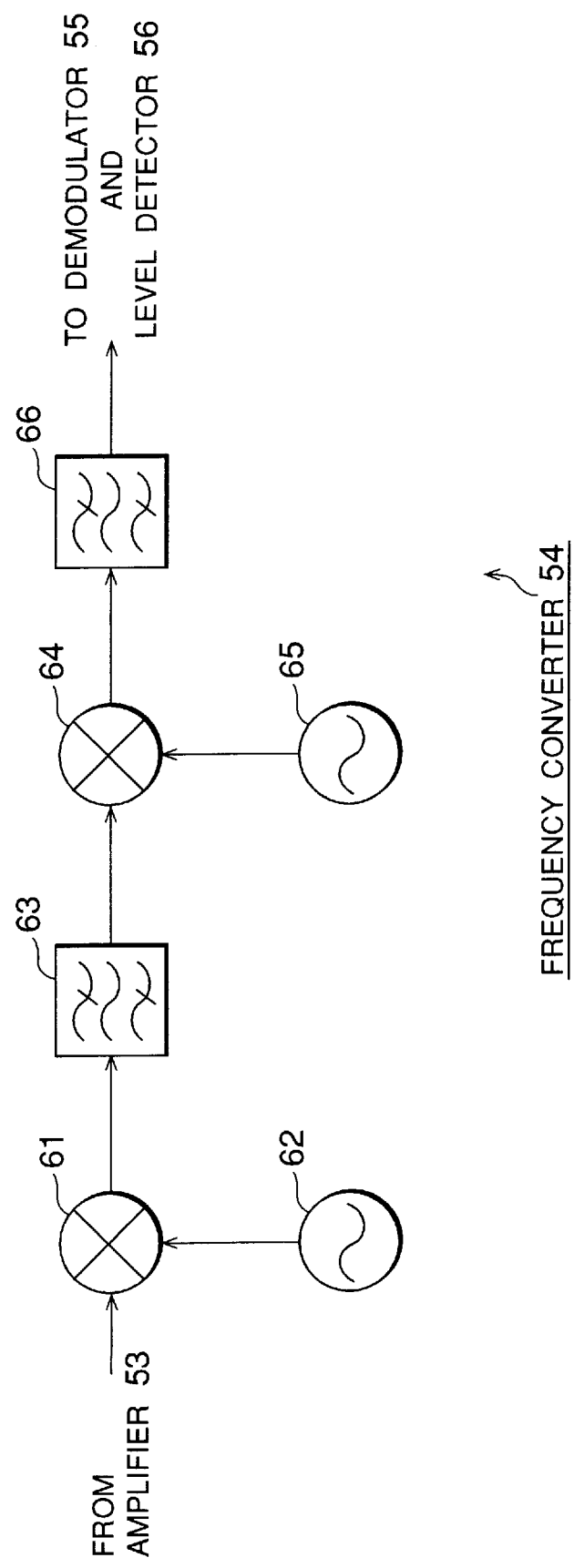
FIG. 7 is a view showing the configuration of an attenuation circuit according to the present invention.

In FIG. 7, the frequency converter 54 is provided with a first mixer 61, a first local oscillator 62, a first band pass filter (BPF) 63, a second mixer 64, a second local oscillator 65 and a second BPF 66.

The radio signal amplified by the amplifier 53 is shifted to a first IF frequency band based on an output from the first local oscillator 62 in the first mixer 61. The radio signal shifted to the first IF frequency band is further shifted to the second frequency band based on an output from the second local oscillator 65 in the second mixer 64 through the first BPF 63. The radio signal shifted to the second frequency band is output to the demodulator 55 through the second BPF 66.

Figure 8:
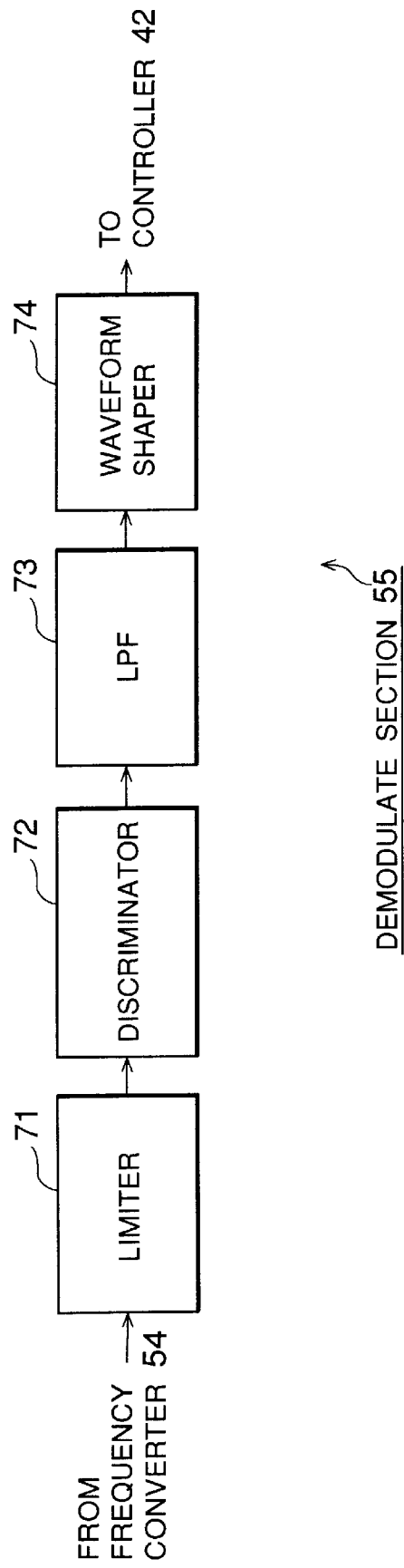
FIG. 8 is a view showing the configuration of an amplifier according to the present invention.

In FIG. 8, the demodulator 55 includes a limiter 71, a discriminator 72, a LPF 73 and a waveform shaper 74.

The radio signal shifted to the second frequency band and amplified to a desired level in the frequency converter 54 is amplitude-limited in the limiter 71 for FM detection. The radio signal is thereafter subjected to frequency-to-voltage conversion to be demodulated in the discriminator 72. The demodulated signal demodulated in the discriminator 72 has noise component outside the desired frequency band which is removed in the LPF 73 and is shaped into a rectangular wave in the waveform shaper 74 to be output to a controller 42 as a digital signal.

Figure 9:
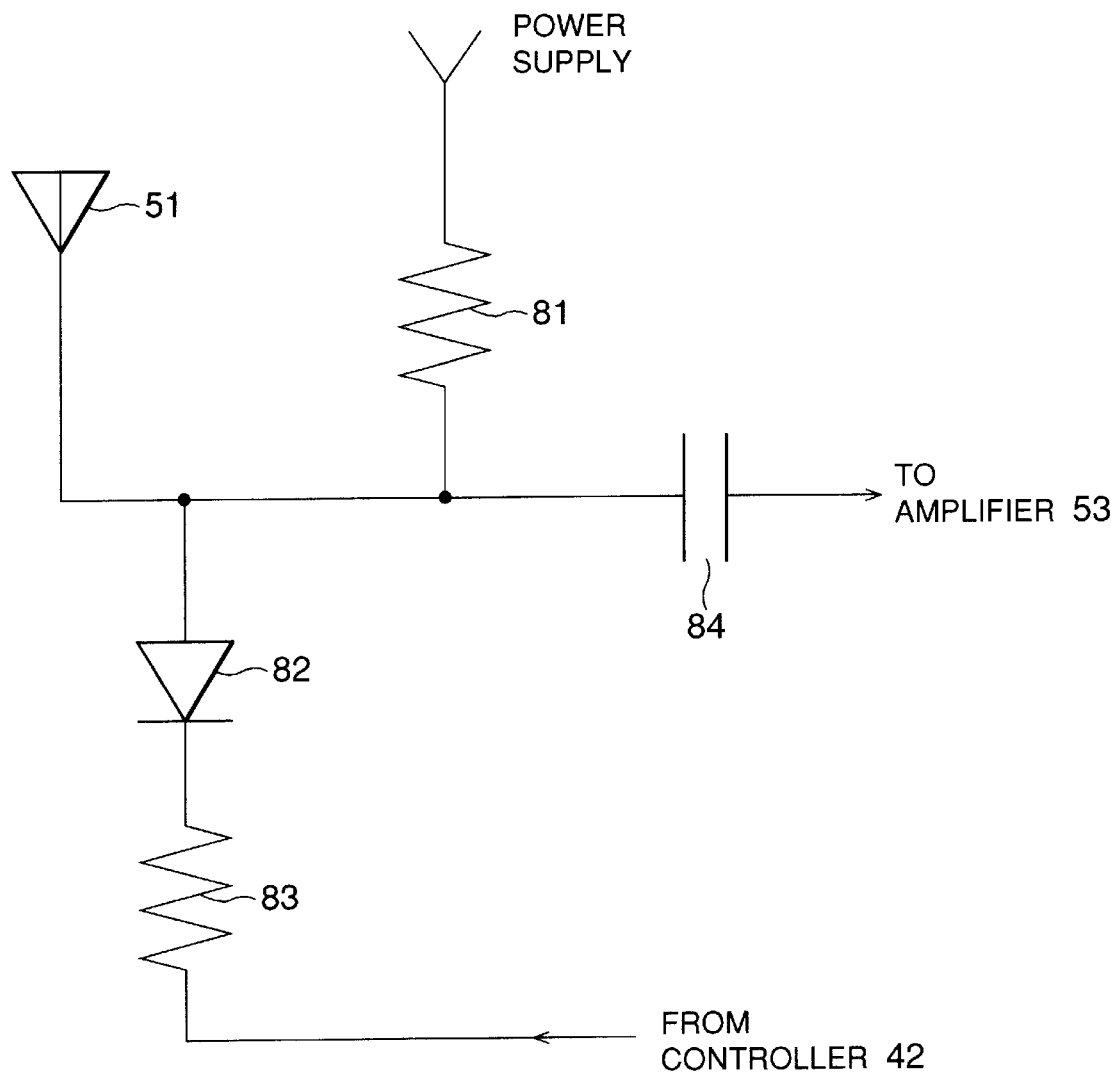
FIG. 9 is a view showing the configuration of a demodulator according to the present invention.

In FIG. 9, the attenuation circuit 52 is provided with a first resistor 81, a diode 82, a second resistor 83 and a capacitor 84.

If the control signal output from the controller 42 is "H", the diode 82 does not become conductive because of no difference in potential between both ends thereof, and the radio signal input from the antenna 51 is input to the amplifier 53 through the capacitor 84 that separates the amplifier 53 from the antenna 51 in terms of direct current. If the control signal output from the controller 42 is "L", the diode 82 becomes conductive because the power supply voltage is applied to an anode of the diode 82 and the current limited by the first resistor 81 and the second resistor 83 flows. When the diode is conductive, the level of the radio signal input from the antenna 51 is lowered.

Figure 10:
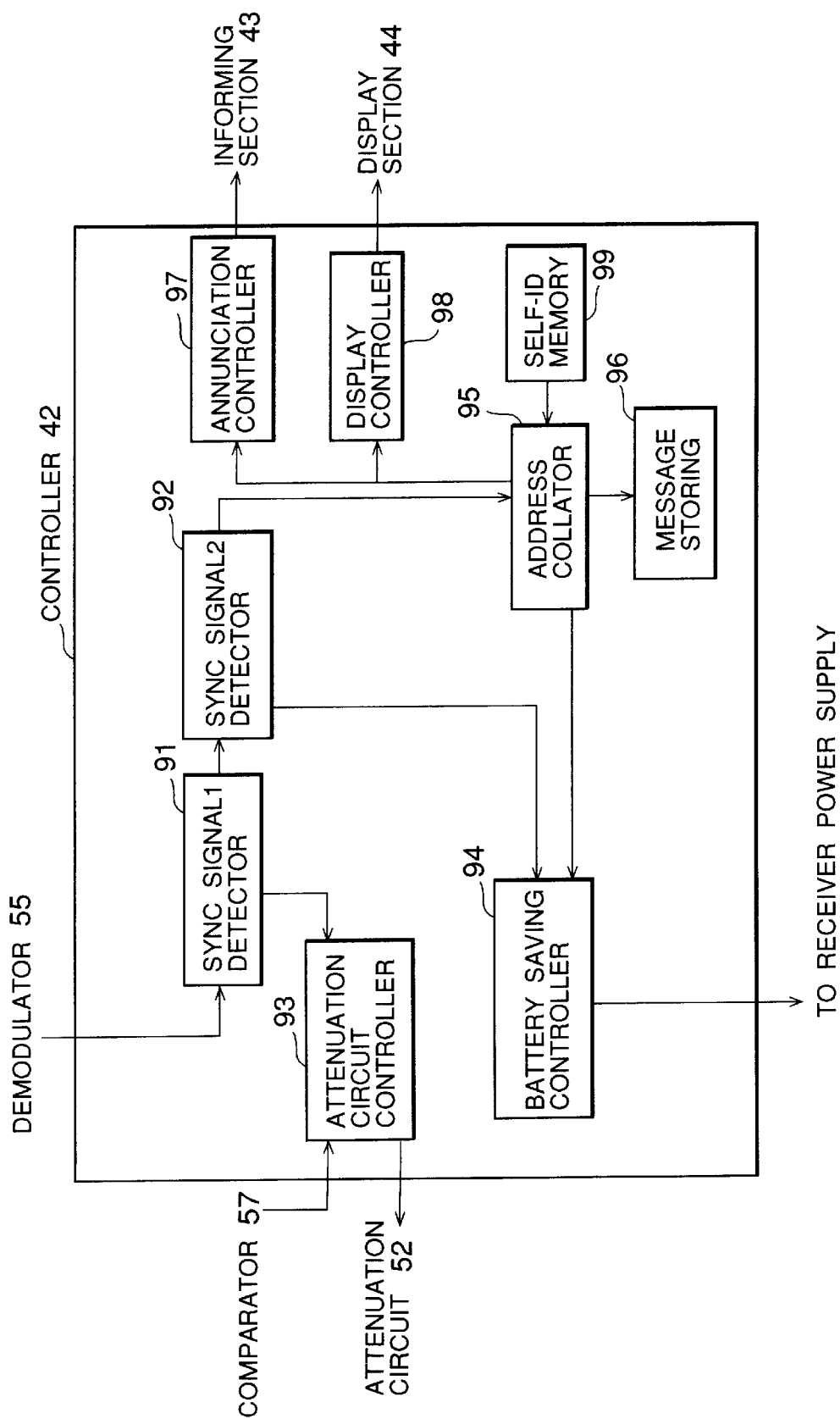
FIG. 10 is a view showing the configuration of a controller according to the present invention.

In FIG. 10, the controller 42 is provided with a sync signal 1 detector 91, a sync signal 2 detector 92, an attenuation circuit controller 93, a battery saving controller 94, an address collator 95, a message storing section 96, an annunciation controller 97, a display controller 98 and a self-ID memory 99.

Based on the base band signal output from the demodulator 55, the sync signal 1 detector 91 makes judgment upon whether the sync signal 1 has been detected. When the sync signal 1 has not been detected, the attenuation circuit controller 93 judges whether the receive electric field level output from the comparator 57 is "H". When the receive electric field level output from the comparator 57 is "H", the attenuation circuit controller 93 outputs a control signal "L" to the attenuation circuit 52 to lower the level of the radio signal.

If the sync signal 1 has been detected, the sync signal 2 detector 92 judges whether the sync signal 2 has been detected. Upon detecting the sync signal 2, the address collator 95 compares the address in the self-frame with the self-address stored in the self-ID memory 99. When the address in the self-frame coincides with the self-address stored in the self-ID memory 99, the received message is temporarily stored in the message storing section 96. At the same time, the informing section 43 is used to inform that the radio selective call receiver has received its own call number through the annunciation controller 97, and the display section 44 displays the received message through the display controller 98.

Since the radio selective call receiver according to the present invention intermittently receives only the assigned frames, the battery saving controller 94 turns off the power supply after detection of the sync signal 2 and again turns on the power supply in the self-frame.

The operation of the radio selective call receiver will now be described in detail in connection with FIG. 11.

Here, the battery saving operation is not the important point in the present invention, thereby omitting the explanation thereof.

Figure 11:
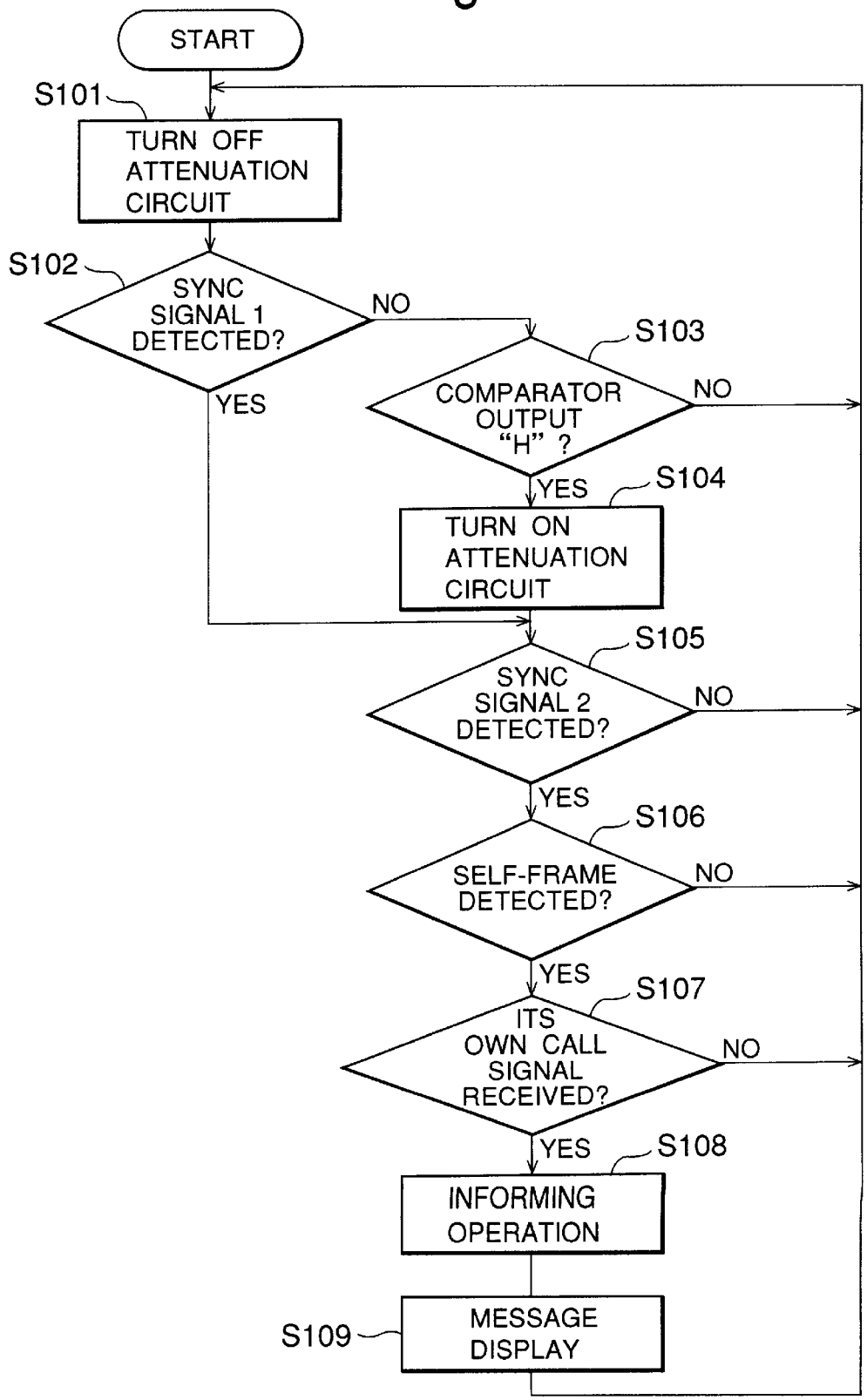
FIG. 11 is a view for explaining the operation of the radio selective call receiver according to the present invention.

Referring to FIG. 11, the controller 42 turns off the attenuation circuit 52 as an initialized state (S101). The controller 42 judges whether the first sync signal, i.e., the sync signal 1 has been detected based on the based band signal output from the demodulator 55 (S102).

When the controller 42 has detected the sync signal 1 (YES in S102), the controller 42 judges whether the second sync signal, i.e., the sync signal 2 has been detected (S105). When the controller 42 has detected the sync signal 2 (YES in S105), the controller 42 confirms a signal for identifying the self-frame (S106). When the controller 42 has confirmed the signal for identifying the self-frame (YES in S106), the controller 42 receives its own call number in the self-frame (S107). When the controller 42 has received its own call number (YES in S107), the controller 42 outputs information representing the success of reception to the informing section 43 to carry out the infoming operation (S108). At the same time, the controller 42 displays the received message on the display section 44 (S109) and returns to the initialized state (S101).

When the controller 42 has failed to detect the sync signal 2 (NO in S105), when the controller 42 has failed to confirm the signal for identifying the self-frame (NO in S106), or when the controller 42 has failed to receive its own call number (NO in S107), the controller 42 terminates the receiving operation to return to the initialized state, thereby restarting the receiving operation (S101).

On the other hand, when the controller 42 has failed to detect the sync signal 1 (NO in S102), the controller 42 judges whether the receive electric field level output from the comparator 57 is "H" (S103).

If the receive electric field level output from the comparator 57 is not equal to "H" (NO in S103), the controller 42 terminates the receiving operation to return to the initialized state and restarts the receiving operation (S101).

If the receive electric field level output from the comparator 57 is "H" (YES in S103), the controller 42 determines that the sync signal 1 is not received due to the interfering wave and outputs the control signal "L" to the attenuation circuit 52 to turn on the attenuation circuit 52 (S104).

With the attenuation circuit 52 being turned on, the controller 42 judges whether the second sync signal, i.e., the sync signal 2 has been detected (S105). If the controller 42 has detected the sync signal 2 (YES in S105), the controller 42 confirms the signal for identifying the self-frame (S106). If the controller 42 has confirmed the signal for identifying the self-frame (YES in S106), the controller 42 receives its own call number in the self-frame (S107). If the controller 42 has received its own call number (YES in S107), the controller 42 outputs information representing the success of reception to the informing section 43 to perform the informing operation (S108). At the same time, the controller 42 displays the received message on the display section 44 (S109) and returns to the initialized state (S101).

If the controller 42 has failed to detect the sync signal 2 (NO in S105), if the controller 42 has failed to confirm the signal for identifying the self-frame (NO in S106) or if the controller 42 has failed to receive its own call number (NO in S107), the controller terminates the receiving operation to return to the initialized state, thereby restarting the receiving operation (S101).

The timing for transmitting the control signal according to the present invention will now be described in connection with FIGS. 12A to 12D.

Referring to FIGS. 12A to 12D, it is assumed that, for example, an address A2 corresponds to the self-frame in the radio selective call receiver according to the present invention. The receiver power supply is turned on when detecting the sync signal 1 and the sync signal 2, and turned off after detecting the sync signal 2. Subsequently, the receiver power supply is again turned on in the address A2 that is the self-frame, and turned off at the end of the address A2. In a message M1, the receiver power supply is again turned on and remains to be on until the sync signal is detected in the next frame.

If the output from the comparator 57 is "H" when the sync signal 1 was not detected, it is determined that the sync signal can not be received due to the interfering wave, and the controller 42 outputs the control signal "L" before the sync signal 2. The control signal "L" output from the controller 42 is used to turn on the attenuation circuit 52 in order to lower the receive electric field level of the radio signal. When the receive electric field level of the radio signal is lowered, the output from the comparator 57 becomes "L", which enables reception of the sync signal 2. After detecting the sync signal 2, the address A2 is confirmed and a message M2 is received.

As described above, since the radio selective call receiver according to the present invention lowers the level of the radio signal with a timing at which the second sync signal is received when determined that the first sync signal can not be received, the receiving ratio can be increased, and receiving the call number in the same frame can prevent the receiving opportunity from being lost.

Although each of the sync signals 1 and 2 in the frame consists of 32 bits in the foregoing embodiment, the present invention is not restricted to a certain number of bits constituting each of the sync signals 1 and 2 in the frame, and a number of bits constituting the sync signal 1 does not have to be the same with that constituting the sync signal 2. Further, each of the sync signals 1 and 2 may be the same.

The above has described the characteristic of the present invention as an example of the radio selective call receiver for lowering the level of the radio signal, but the present invention is not limited to this type of radio selective call receiver. The present invention can be therefore applied in all types of radio receiver for lowering the signal level.

Obviously, numerous additional modifications and variations of the present invention are possible in light of the above teachings. It is, therefore, to be understood that within the scope of the appended claims, the invention may be practiced otherwise than as specifically described herein.

What is claimed is:

1. A radio selective call receiver comprising:

receiving means for receiving a radio signal including within one frame a first and a second sync signal followed by an address signal and a message signal, wherein said one frame comprises no more than two sync signals;

first output means for outputting a first signal indicating whether said first sync signal has been detected from said radio signal received by said receiving means; and attenuating means for attenuating a level of said radio signal with a timing at which said second sync signal is received based on said first signal.

2. A radio selective call receiver as claimed in claim 1, further comprising:

demodulating means for demodulating said radio signal to a base band signal;

second output means for outputting a direct current voltage relative to an electric field intensity level of said radio signal; and comparing means for comparing said direct current voltage with a predetermined voltage;

wherein said first output means outputs said first signal based on said base band signal and the comparing result of said comparing means.

3. A radio selective call receiver as claimed in claim 2, further comprising:

informing means for informing that a call number in the same frame has been received by said attenuating means at the time of receiving said call number; and display means for displaying a message when receiving a call number in the same frame by said attenuating means.

4. A radio selective call receiver comprising:

receiving means for receiving a radio signal having a first and a second sync signal, and address signal and a message signal following said sync signals in one frame, wherein said one frame comprises no more than two sync signals;

demodulating means for demodulating said radio signal to a base band signal;

first output means for outputting a direct current voltage relative to an electric field intensity level of said radio signal;

comparing means for comparing said direct current voltage with a predetermined voltage;

determining means for determining whether said first sync signal has been detected from said radio signal received by said receiving means by said demodulating means; and attenuating means for attenuating a level of said radio signal with a timing at which said second sync signal is received based on the result of said comparing means and said determining means.

5. A radio selective call receiver as claimed in claim 4, further comprising:

informing means for informing that a call number in the same frame has been received by said attenuating means at the time of receiving said call number; and display means for displaying a message when receiving a call number in the same frame by said attenuating means.

6. A radio selective call receiver comprising:

receiving means for receiving a radio signal having a first and a second sync signal, an address signal and a message signal following said sync signals within one frame, wherein said one frame comprises no more than two sync signals;

demodulating means for demodulating said radio signal to a base band signal;

first output means for outputting a direct current voltage relative to an electric field intensity level of said radio signal;

comparing means for comparing said direct current voltage with a predetermined voltage;

determining means for determining whether said first sync signal has been detected from said radio signal received by said receiving means by said demodulating means; and second output means for outputting a control signal with a timing at which said second sync signal is received based on the result of said comparing means and determining means;

attenuating means for attenuating a level of said radio signal by said control signal;

informing means for informing that a call number in the same frame has been received by said attenuating means at the time of receiving said call number; and display means for displaying a message when receiving a call number in the same frame by said attenuating means.

7. A radio selective call receiving method comprising the steps of:

receiving a radio signal having in one frame a first and a second sync signal, an address signal and a message signal following said sync signals, wherein said one frame comprises no more than two sync signals;

outputting a first signal indicating whether said first sync signal has been detected from said radio signal received; and attenuating a level of said radio signal when said first signal indicated failure to detect said first sync signal with a timing permitting said second sync signal to be received.

8. A radio selective call receiving method as claimed in claim 7, further comprising the steps of:

demodulating said radio signal to a base band signal;

outputting a direct current voltage relative to an electric field intensity level of said radio signal; and comparing said direct current voltage with a predetermined voltage;

wherein said first signal outputting step outputs said first signal based on said base band signal and the comparing result of said comparing step.

9. A radio selective call receiving method as claimed in claim 8, further comprising the steps of:

informing that a call number in the same frame has been received at the time of receiving said call number; and displaying a message when receiving a call number in the same frame.

10. A radio selective call receiving method comprising the steps of:

receiving a radio signal comprising a frame with a first and a second sync signal, an address signal and a message signal following said sync signals, wherein said frame comprises no more than two sync signals;

demodulating said radio signal to a base band signal;

outputting a direct current voltage relative to an electric field intensity level of said radio signal;

comparing said direct current voltage with a predetermined voltage to output a receive electric field level;

determining whether said first sync signal has been detected from said radio signal received by said base band signal; and attenuating a level of said radio signal with a timing at which said second sync signal is received based on the result of said comparing step and determining step.

11. A radio selective call receiving method as claimed in claim 10, further comprising the steps of:

informing that a call number in the same frame has been received at the time of receiving said call number; and displaying a message when receiving a call number in the same frame.

12. A radio selective call receiving method comprising the steps of:

receiving a radio signal having in one frame a first and an adjacent second sync signal, an address signal and a message signal following said sync signals, wherein said one frame comprises no more than two sync signals;

demodulating said radio signal to a base band signal;

outputting a direct current voltage relative to an electric field intensity level of said radio signal;

comparing said direct current voltage with a predetermined voltage to output a receive electric field level;

determining whether said first sync signal has been detected from said radio signal received by said base band signal;

outputting a control signal with a timing at which said second sync signal is received based on the result of said comparing step and determining step;

attenuating a level of said radio signal by said control signal;

informing that a call number in the same frame has been received at the time of receiving said call number; and displaying a message when receiving a call number in the same frame.

13. A radio selective call receiver comprising:

a receiver for receiving a radio signal including a frame comprising a first and a second sync signal, an address signal and a message signal following to said sync signals, wherein said frame comprises no more than two sync signals;

a first output circuit for outputting a first signal indictating whether said first sync signal has been detected from said radio signal received by said receiver; and an attenuation circuit for attenuating a level of said radio signal with a timing at which said second sync signal is received based on said first signal.

14. A radio selective call receiver as claimed in claim 13, further comprising:

a demodulator for demodulating said radio signal to a base band signal;

a level detector for outputting a direct current voltage relative to an electric field intensity level of said radio signal; and a comparator for comparing said direct current voltage with a predetermined voltage;

wherein said first output circuit outputs said first signal based on said base band signal and the comparing result of said comparator.

15. A radio selective call receiver as claimed in claim 14, further comprising:

an informing section for informing that a call number in the same frame has been received by said attenuation circuit at the time of receiving said call number; and a display section for displaying a message when receiving a call number in the same frame by said attenuation circuit.

16. A radio selective call receiver comprising:

a receiver for receiving a radio signal having a first and a second sync signal followed by and address signal and a message signal in one frame, wherein said one frame comprises no more than two sync signals;

a demodulator for demodulating said radio signal to a base band signal;

a first output circuit for outputting a direct current voltage relative to an electric field intensity level of said radio signal;

a comparator for comparing said direct current voltage with a predetermined voltage;

a determining circuit for determining whether said first sync signal has been detected from said radio signal said receiver by said demodulator; and an attenuating circuit for attenuating a level of said radio signal with a timing at which said second sync signal is received based on the result of said comparator and determining circuit.

17. A radio selective call receiver as claimed in claim 16, further comprising:

an informing section for informing that a call number in the same frame has been received by said attenuation circuit at the time of receiving said call number; and a display section for displaying a message when receiving a call number in the same frame by said attenuation circuit.

18. A radio selective call receiver comprising:

a receiver for receiving a radio signal having a first and a second sync signal, an address signal and a message signal following said sync signals in one frame, wherein said one frame comprises no more than two sync signals;

a demodulator for demodulating said radio signal to a base band signal;

a first output circuit for outputting a direct current voltage relative to an electric field intensity level of said radio signal;

a comparator for comparing said direct current voltage with a predetermined voltage;

determining circuit for determining whether said first sync signal has been detected from said radio signal received by said receiver by said demodulator;

second output circuit for outputting a control signal with a timing at which said second sync signal is received based on the result of said comparator and determining circuit;

an attenuation circuit for attenuating a level of said radio signal by said control signal;

an informing section for informing that a call number in the same frame has been received by said attenuation circuit at the time of receiving said call number; and a display section for displaying a message when receiving a call number in the same frame by said attenuation circuit.

* * * * *